(12) United States Patent
Jang et al.

(10) Patent No.: US 12,389,651 B2
(45) Date of Patent: Aug. 12, 2025

(54) SEMICONDUCTOR STRUCTURE AND FABRICATION METHOD THEREOF

(71) Applicant: CHANGXIN MEMORY TECHNOLOGIES, INC., Hefei (CN)

(72) Inventors: Semyeong Jang, Hefei (CN); Joonsuk Moon, Hefei (CN); Deyuan Xiao, Hefei (CN); Jo-Lan Chin, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 449 days.

(21) Appl. No.: 17/893,209

(22) Filed: Aug. 23, 2022

(65) Prior Publication Data

US 2023/0275130 A1    Aug. 31, 2023

Related U.S. Application Data

(63) Continuation of application No. PCT/CN2022/084782, filed on Apr. 1, 2022.

(30) Foreign Application Priority Data

Jan. 17, 2022   (CN) .......................... 202210048953.X

(51) Int. Cl.
   *H10D 64/01*     (2025.01)
   *H01L 21/02*     (2006.01)
   (Continued)

(52) U.S. Cl.
   CPC ....... *H10D 64/01* (2025.01); *H01L 21/02164* (2013.01); *H01L 21/02238* (2013.01);
   (Continued)

(58) Field of Classification Search
   CPC .. H10D 64/01; H10D 30/6728; H10D 30/014; H10D 30/6735; H10D 62/122;
   (Continued)

(56) References Cited

U.S. PATENT DOCUMENTS

2022/0277985 A1* 9/2022 Huang ............... H10D 84/0151
2022/0310457 A1* 9/2022 Chang ................ H10D 84/0144

FOREIGN PATENT DOCUMENTS

| CN | 104009082 A | 8/2014 |
|---|---|---|
| CN | 106328647 A | 1/2017 |

(Continued)

*Primary Examiner* — Zandra V Smith
*Assistant Examiner* — Andre C Stevenson
(74) *Attorney, Agent, or Firm* — Kilpatrick Townsend & Stockton LLP

(57) ABSTRACT

Embodiments relate to a semiconductor structure and a fabrication method. The method includes: providing a substrate, where a first trench is formed in the substrate; forming a first dielectric layer and a protective material layer in the first trench, where the first dielectric layer is positioned between the protective material layer and the substrate, and an upper surface of the first dielectric layer is lower than an upper surface of the substrate, to expose a portion of a side wall of the first trench; forming a second dielectric layer on the exposed side wall of the first trench; and filling the second trench to form a work function structure, where the work function structure includes a first work function layer and a second work function layer, where the second work function layer is positioned on an upper surface of the first work function layer.

7 Claims, 8 Drawing Sheets

(51) Int. Cl.
*H01L 21/28* (2025.01)
*H01L 21/321* (2006.01)
*H10D 30/01* (2025.01)
*H10D 30/67* (2025.01)
*H10D 62/10* (2025.01)

(52) U.S. Cl.
CPC .. *H01L 21/28097* (2013.01); *H01L 21/28123* (2013.01); *H01L 21/28247* (2013.01); *H01L 21/32105* (2013.01); *H10D 30/014* (2025.01); *H10D 30/6728* (2025.01); *H10D 30/6735* (2025.01); *H10D 30/6739* (2025.01); *H10D 62/122* (2025.01)

(58) Field of Classification Search
CPC .......... H10D 30/6739; H01L 21/02164; H01L 21/02238; H01L 21/28097; H01L 21/28123; H01L 21/28247; H01L 21/32105
See application file for complete search history.

(56) References Cited

FOREIGN PATENT DOCUMENTS

| | | | |
|---|---|---|---|
| CN | 107527912 | A | 12/2017 |
| CN | 108807389 | A | 11/2018 |
| CN | 108987282 | A | 12/2018 |
| CN | 110931487 | A | 3/2020 |
| CN | 111627819 | A | 9/2020 |

\* cited by examiner

SEMICONDUCTOR STRUCTURE AND FABRICATION METHOD THEREOF

CROSS-REFERENCE TO RELATED APPLICATION

The present disclosure is a continuation of PCT/CN2022/084782, filed on Apr. 1, 2022, which claims priority to Chinese Patent Application No. 202210048953X filed to the State Patent Intellectual Property Office on Jan. 17, 2022, the entire contents of which are incorporated herein by reference.

TECHNICAL FIELD

The present disclosure relates to the field of semiconductor technology, and more particularly, to a semiconductor structure and a fabrication method thereof.

BACKGROUND

In a vertical gate-all-around (VGAA) transistor, a trench region of the transistor extends in a direction perpendicular to a surface of a substrate, which helps to increase area utilization of a semiconductor structure provided with the transistor, and further reduce a feature size. However, leakage current of the transistor is larger, which has a negative effect on performance of the semiconductor structure. Therefore, how to improve the performance of the semiconductor structure becomes an urgent problem to be solved during use of the VGAA transistor.

SUMMARY

According to various embodiments of the present disclosure, a semiconductor structure and a fabrication method thereof are provided.

According to some embodiments, one aspect of the present disclosure provides a method for fabricating a semiconductor structure, including:
  providing a substrate, where a first trench is formed in the substrate;
  forming a first dielectric layer and a protective material layer in the first trench, where the first dielectric layer is positioned between the protective material layer and the substrate, and an upper surface of the first dielectric layer is lower than an upper surface of the substrate to expose a portion of a side wall of the first trench;
  forming a second dielectric layer on the exposed side wall of the first trench, where a second trench is formed between the second dielectric layer and the protective material layer, and the second dielectric layer is in contact with the first dielectric layer; and
  filling the second trench to form a work function structure, where the work function structure includes a first work function layer and a second work function layer.

The second work function layer is positioned on an upper surface of the first work function layer, and a work function of the second work function layer is smaller than a work function of the first work function layer.

According to some embodiments, the forming a first dielectric layer and a protective material layer in the first trench includes:
  forming a first dielectric material layer on an inner wall of the first trench;
  removing the first dielectric material layer at a bottom of the first trench;
  filling the first trench up with the protective material layer; and
  removing a portion of the first dielectric material layer adjacent to the upper surface of the substrate, where a reserved portion of the first dielectric material layer is the first dielectric layer.

According to some embodiments, the substrate includes a silicon substrate; a portion of the silicon substrate is exposed at the bottom of the first trench; and after the removing the first dielectric material layer at a bottom of the first trench, the method further includes:
  implanting a first metallic material into the bottom of the first trench; and
  performing an annealing process, such that the first metallic material reacts with the silicon substrate to generate metal silicides,
  where the metal silicides at the bottoms of the adjacent first trenches are in contact with each other.

According to some embodiments, the substrate internally further includes an active pillar positioned between the adjacent first trenches, the second dielectric layer includes a first silicon oxide layer, and the forming a second dielectric layer on the exposed side wall of the first trench includes:
  growing the first silicon oxide layer on the side wall of the first trench by means of thermal oxidation.

According to some embodiments, an angle between a bottom of the second dielectric layer and a first direction is greater than 0° and less than or equal to 90°.

The first direction refers to a direction where the bottom of the first trench points to an opening of the first trench.

According to some embodiments, the filling the second trench to form a work function structure includes:
  filling the second trench up with a first work function material layer;
  removing a redundant portion of the first work function material layer to obtain a first work function structure, where an upper surface of the first work function structure is lower than the upper surface of the substrate;
  forming a second work function material layer on the upper surface of the first work function structure, where an upper surface of the second work function material layer is not lower than the upper surface of the substrate, and the second work function material layer includes a second metallic material; and
  performing an annealing process such that the second metallic material diffuses into an upper portion of the first work function structure to form a second work function layer and obtain a first work function layer formed from a remaining portion of the first work function structure.

According to some embodiments, after the performing an annealing process, the method further includes:
  removing the second work function material layer on an upper surface of the second work function layer.

According to some embodiments, the work function structure further includes a third work function layer positioned on the upper surface of the second work function layer; and after the performing an annealing process, the method further includes:
  removing a portion of the second work function material layer on the upper surface of the second work function layer to obtain the third work function layer formed from a remaining portion of the second work function material layer.

According to some embodiments, the first work function material layer includes a third metallic material, and a work function of the third metallic material is greater than a work function of the second metallic material.

According to some embodiments, the third metallic material includes titanium, and the second metallic material includes at least one of lanthanum, zirconium, hafnium, and aluminum.

According to some embodiments, a height of the second work function layer is greater than or equal to a height of the first work function layer.

According to some embodiments, an upper surface of the work function structure is lower than the upper surface of the substrate; and after the filling the second trench to form a work function structure, the method further includes:
  forming an isolation material layer on an upper surface of the work function structure, where an upper surface of the isolation material layer is not lower than the upper surface of the substrate.

According to some embodiments, the isolation material layer and the protective material layer are formed from a same material.

According to some embodiments, another aspect of the present disclosure discloses a semiconductor structure, which includes:
  a substrate, where a first trench is formed in the substrate;
  a protective material layer positioned in the first trench;
  a first dielectric layer positioned on a side wall of the first trench and between the protective material layer and the substrate;
  a second dielectric layer positioned on the side wall of the first trench, where the second dielectric layer is in contact with the first dielectric layer and is positioned between the protective material layer and the substrate, and a second trench is provided between the second dielectric layer and the protective material layer; and
  a work function structure positioned in the second trench, where the work function structure includes a first work function layer and a second work function layer, where the second work function layer is positioned on an upper surface of the first work function layer, and a work function of the second work function layer is smaller than a work function of the first work function layer.

According to some embodiments, an angle between a bottom of the second dielectric layer and a first direction is greater than 0° and less than or equal to 90°.

The first direction refers to a direction where the bottom of the first trench points to an opening of the first trench.

According to some embodiments, the second work function layer includes a second metallic material, and the first work function layer includes a third metallic material, where a work function of the third metallic material is greater than a work function of the second metallic material.

According to some embodiments, the third metallic material includes titanium, and the second metallic material includes at least one of lanthanum, zirconium, hafnium, and aluminum.

According to some embodiments, the work function structure further includes:
  a third work function layer positioned on an upper surface of the second work function layer, where the third work function layer includes the second metallic material.

According to some embodiments, an upper surface of the work function structure is lower than an upper surface of the substrate, and the semiconductor structure further includes:
  an isolation material layer positioned on the upper surface of the work function structure, where an upper surface of the isolation material layer is not lower than the upper surface of the substrate.

According to some embodiments, a height of the second work function layer is greater than or equal to a height of the first work function layer.

The embodiments of the present disclosure may at least have following advantages.

In the method for fabricating a semiconductor structure, a first trench is formed in a substrate, a protective material layer is formed in the first trench, and a first dielectric layer is positioned between the protective material layer and the substrate. A second dielectric layer is positioned on an exposed side wall of the first trench and is in contact with the first dielectric layer, and a second trench is formed between the second dielectric layer and the protective material layer. The second trench is filled to form a work function structure, where the work function structure includes a first work function layer and a second work function layer positioned on an upper surface of the first work function layer, and a work function of the second work function layer is smaller than a work function of the first work function layer. Without changing a resistance, leakage current of the semiconductor structure using the work function structure as a gate structure is reduced, and electrical stability and performance of the semiconductor structure are improved.

In the above semiconductor structure, a first trench is formed in a substrate, a protective material layer is formed in the first trench, and a first dielectric layer is positioned between the protective material layer and the substrate. A second dielectric layer is positioned on an exposed side wall of the first trench and is in contact with the first dielectric layer, and a second trench is formed between the second dielectric layer and the protective material layer. A work function structure is positioned in the second trench, where the work function structure includes a first work function layer and a second work function layer positioned on an upper surface of the first work function layer, and a work function of the second work function layer is smaller than a work function of the first work function layer. Without changing a resistance, leakage current of the semiconductor structure using the work function structure as a gate structure is reduced, and electrical stability and performance of the semiconductor structure are improved.

Details of one or more embodiments of the present disclosure are set forth in the following drawings and descriptions. Other features, objectives, and advantages of the present disclosure will become apparent from the specification, the drawings, and the claims.

BRIEF DESCRIPTION OF THE DRAWINGS

To describe the technical solutions of the embodiments of the present disclosure or that of the prior art more clearly, the accompanying drawings required for describing the embodiments or the prior art will be briefly introduced below. Apparently, the accompanying drawings in the following description are merely some embodiments of the present disclosure. To those of ordinary skills in the art, other accompanying drawings may also be derived from these accompanying drawings without creative efforts.

REFERENCE NUMERALS IN THE ATTACHED DRAWINGS

Figure 1:
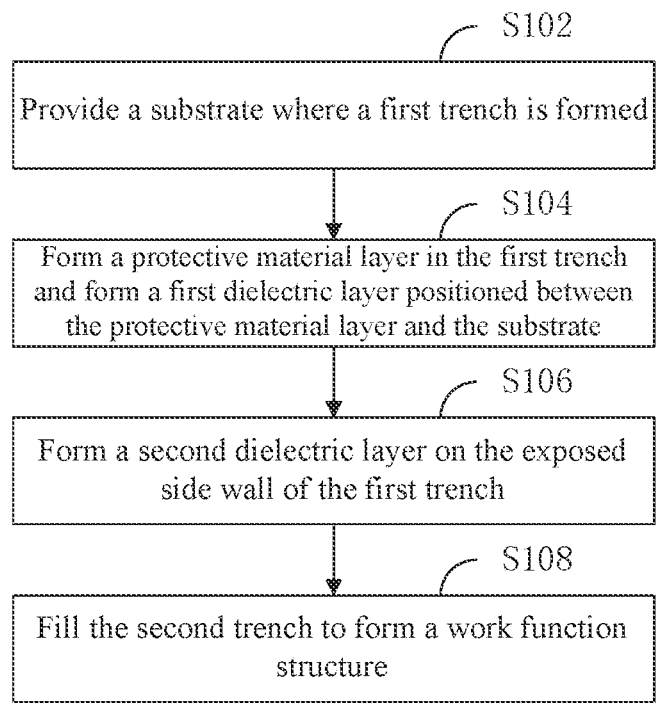
FIG. 1 is a schematic flowchart of a method for fabricating a semiconductor structure in an embodiment.

102: substrate; 104: first trench; 106: first dielectric material layer; 108: barrier layer; 110: hard mask layer; 112: metal silicide; 114: bit line structure; 116: protective material layer; 118: second dielectric layer; 120: second trench; 122: first work function material layer; 124: second work function material layer; 126: work function structure; 128: isolation material layer; 202: first dielectric layer; 204: first work function structure; 206: second work function layer; 208: first work function layer; 210: third work function layer; 212: drift region; 214: first portion; and 216: second portion.

DETAILED DESCRIPTION

For ease of understanding the present disclosure, the present disclosure will be described more fully hereinafter with reference to the accompanying drawings. Embodiments of the present disclosure are presented in the accompanying drawings. However, the present disclosure may be embodied in many different forms and should not be limited to the embodiments set forth herein. Rather, these embodiments are provided such that the present disclosure will be more thorough and complete.

Unless otherwise defined, all technical and scientific terms employed herein have the same meaning as commonly understood by one of ordinary skill in the art to which the present disclosure belongs. The terms employed in the specification of the present disclosure are merely for the purpose of describing some embodiments and are not intended for limiting the present disclosure. As used herein, the term "and/or" includes any and all combinations of one or more of the associated listed items.

In addition, in the description of the present disclosure, it is to be understood that the orientations or positions represented by the terms of "above", "below", "vertical", "horizontal", "inside", "outside", and the like are based on methods or positions shown in the accompanying drawings, they are merely for ease of a description of the present disclosure and a simplified description instead of being intended to indicate or imply the device or element to have a special orientation or to be configured and operated in a special orientation. Thus, they cannot be understood as limiting of the present disclosure.

It is to be understood that the terms "first", "second", etc. used in the present disclosure may be used herein to describe various elements, but these elements are not limited by these terms. These terms are only intended for distinguishing a first element from another one. For example, a first dielectric layer may be referred to as a second dielectric layer, and, similarly, a second dielectric layer may be referred to as a first dielectric layer, without departing from the scope of the present disclosure. Both the first dielectric layer and the second dielectric layer are dielectric layers, but they are not the same dielectric layer.

In addition, terms "first" and "second" are used only for purposes of description and are not intended to indicate or imply relative importance or to imply the number of indicated technical features. Thus, the feature defined with "first" and "second" may explicitly or implicitly include at least one such feature. In the description of the present disclosure, "a plurality of" refers to at least two, for example, two, three, etc., unless otherwise expressly specified. In the description of the present disclosure, "a number of" refers to at least one, for example, one, two, etc., unless otherwise expressly specified.

FIG. 1 is a schematic flowchart of a method for fabricating a semiconductor structure in an embodiment. As shown in FIG. 1, in this embodiment, a method for fabricating a semiconductor structure is provided, which includes following steps.

S102: Providing a Substrate where a First Trench is Formed.

In some embodiments, a substrate is provided, and a first trench is formed in the substrate, where the substrate may be made of undoped monocrystalline silicon, impurity-doped monocrystalline silicon, silicon on insulator (SOI), stacked silicon on insulator (SSOI), silicon germanium on insulator (S—SiGeOI), silicon germanium on insulator (SiGeOI), and germanium on insulator (GeOI). As an example, in this embodiment, monocrystalline silicon is selected as a material for forming the substrate.

S104: Forming a Protective Material Layer in the First Trench and Forming a First Dielectric Layer Positioned Between the Protective Material Layer and the Substrate.

In some embodiments, a first dielectric layer and a protective material layer are respectively formed in the first trench, where the first dielectric layer is positioned between the protective material layer and the substrate, and an upper surface of the first dielectric layer is lower than that of the substrate, to expose a portion of a side wall of the first trench. It is to be understood that the first dielectric layer is positioned on a side wall of the first trench away from an opening, and a side wall of the first trench close to the opening is exposed and is not covered by the first dielectric layer. For example, the first dielectric layer may extend along the side wall of the first trench and cover a bottom of the first trench, or may only cover the side wall of the first trench away from the opening.

S106: Forming a Second Dielectric Layer on the Exposed Side Wall of the First Trench.

A second dielectric layer is formed on the exposed side wall of the first trench, a second trench is formed between the second dielectric layer and the protective material layer, and the second dielectric layer is in contact with the first dielectric layer. In some embodiments, the second dielectric layer is formed on the side wall of the first trench close to the opening and not covered by the first dielectric layer, the second dielectric layer is in contact with the first dielectric layer positioned on the side wall of the first trench, and a void between the second dielectric layer and the protective material layer in the first trench is the second trench.

S108: Filling the Second Trench to Form a Work Function Structure.

In some embodiments, the second trench is filled to form a work function structure, and the work function structure includes a first work function layer and a second work function layer, where the second work function layer is positioned on an upper surface of the first work function layer, and a work function of the second work function layer is smaller than that of the first work function layer. The work function structure may be used as a gate structure of a transistor and a word line structure of a memory device, and the work function of the second work function structure is lower than that of the first work function layer.

In the method for fabricating a semiconductor structure, the first trench is formed in the substrate, the protective material layer is formed in the first trench, and the first dielectric layer is positioned between the protective material layer and the substrate. The second dielectric layer is positioned on the exposed side wall of the first trench and is in contact with the first dielectric layer, and the second trench is formed between the second dielectric layer and the protective material layer. The second trench is filled to form the work function structure, where the work function structure includes a first work function layer and a second work function layer positioned on the upper surface of the first work function layer, and the work function of the second work function layer is smaller than that of the first work function layer. Without changing a resistance, leakage current of the semiconductor structure using the work function structure as the gate structure is reduced, and electrical stability and performance of the semiconductor structure are improved.

Figure 2:
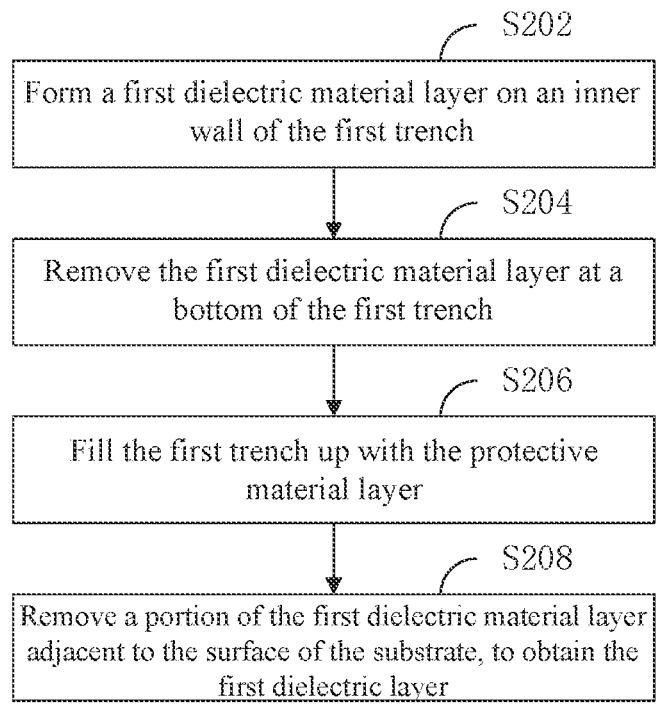
FIG. 2 is a schematic flowchart of Step S104 in an embodiment.
Figure 3:
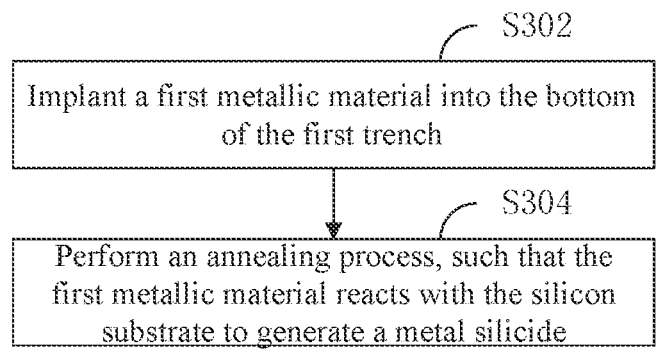
FIG. 3 is a schematic flowchart of a method for fabricating a semiconductor structure in another embodiment.
Figure 4:
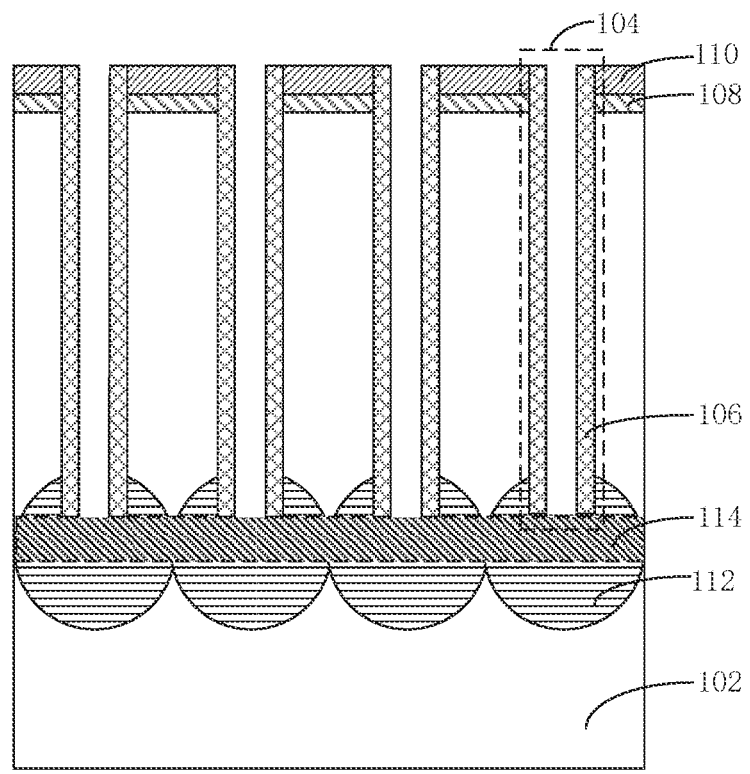
FIG. 4 is a schematic cross-sectional view of a semiconductor structure obtained after a metal silicide is formed in an embodiment.
Figure 5:
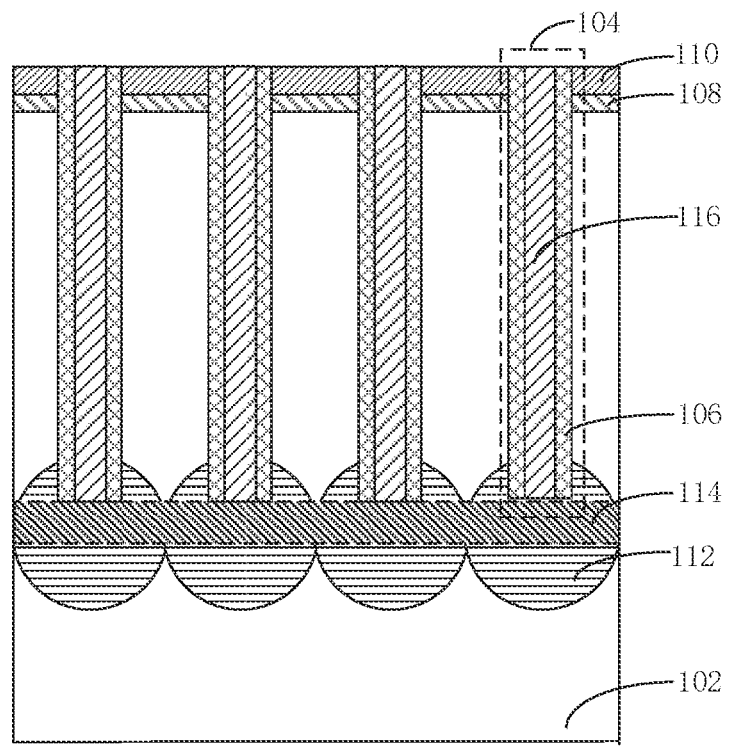
FIG. 5 is a schematic cross-sectional view of a semiconductor structure obtained after a protective material layer is formed in an embodiment corresponding to FIG. 4.
Figure 6:
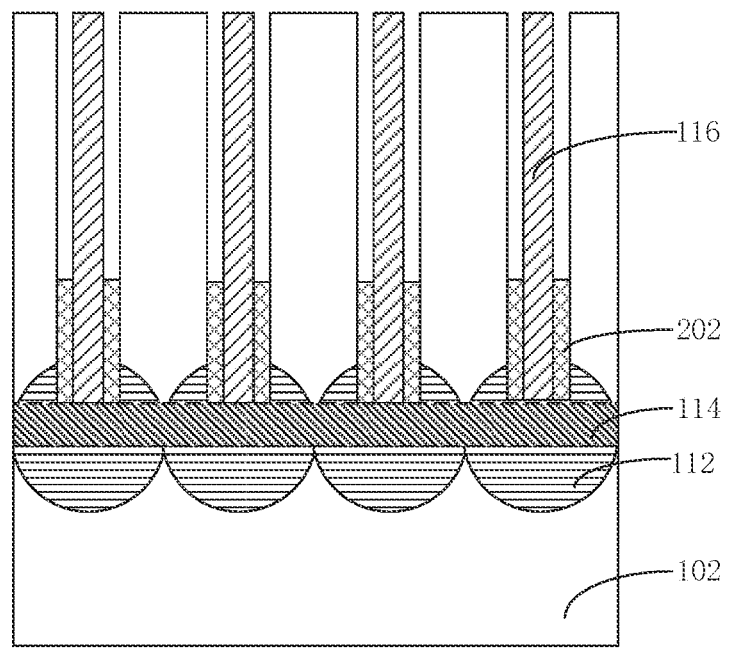
FIG. 6 is a schematic cross-sectional view of a semiconductor structure obtained after a first dielectric layer is formed in an embodiment corresponding to FIG. 5.

FIG. 2 is a schematic flowchart of Step S104 in an embodiment, FIG. 3 is a schematic flowchart of a method for fabricating a semiconductor structure in another embodiment, FIG. 4 is a schematic cross-sectional view of a semiconductor structure obtained after a metal silicide is formed in an embodiment, FIG. 5 is a schematic cross-sectional view of a semiconductor structure obtained after a protective material layer is formed in an embodiment corresponding to FIG. 4, and FIG. 6 is a schematic cross-sectional view of a semiconductor structure obtained after a first dielectric layer is formed in an embodiment corresponding to FIG. 5. As shown in FIG. 4, FIG. 5 and FIG. 6, as an example, Step S104 includes following steps.

S202: Forming a First Dielectric Material Layer on an Inner Wall of the First Trench.

As shown in FIG. 4, first, a substrate 102 is provided, where a first trench 104 is formed in the substrate 102. Next, first dielectric material layers 106 are formed on a side wall and a bottom of the first trench 104, where the first dielectric material layers 106 between the side walls of the first trench 104 are not in contact with each other. For example, a material for forming the first dielectric material layer 106 includes one or more of a nitride, an oxide, and an oxynitride, such as silicon dioxide, silicon nitride, and silicon oxynitride. For example, the material for forming the first dielectric material layer 106 is silicon dioxide.

As shown in FIG. 4, as an example, the method for fabricating a semiconductor structure further includes: forming a barrier layer 108 on the substrate 102. The substrate 102 (active pillar) between adjacent first trenches 104 may be isolated by means of the barrier layer 108, thereby avoiding having a negative effect on the substrate 102 (active pillar) between the adjacent first trenches 104 during a subsequent process of forming a metal silicide. For example, a material for forming the barrier layer 108 includes one or more of a nitride, an oxide and an oxynitride, such as silicon dioxide, silicon nitride, and silicon oxynitride.

As an example, the method for fabricating a semiconductor structure further includes: forming a hard mask layer 110 on the substrate 102. A shape and a position of the first trench 104 may be defined by means of the hard mask layer 110, and the hard mask layer 110 may also serve as an isolation structure in the process of forming the metal silicide, thereby further avoiding having a negative effect on the substrate 102 (active pillar) between the adjacent first trenches 104 in the process of forming the metal silicide. For example, the hard mask layer 110 is formed on an upper surface of the barrier layer 108. For example, a material for forming the hard mask layer 110 includes one or more of a nitride, an oxide and an oxynitride, such as silicon dioxide, silicon nitride, and silicon oxynitride. It is to be understood that the material for forming the hard mask layer 110 and the material for forming the barrier layer 108 may be same or may be different. For example, the material for forming the hard mask layer 110 is silicon nitride, and the material for forming the barrier layer 108 is silicon dioxide.

S204: Removing the First Dielectric Material Layer at a Bottom of the First Trench.

As shown in FIG. 4, the first dielectric material layer 106 at the bottom of the first trench 104 is removed by means of an etching process. When the barrier layer 108 and/or the hard mask layer 110 are formed on the substrate 102, the barrier layer 108 and/or the hard mask layer 110 may be used as an etch stop structure to avoid causing damage to the substrate 102 (active pillar) between the adjacent first trenches 104 in the etching process, thereby protecting the substrate 102.

As shown in FIG. 3 and FIG. 4, as an example, the substrate 102 includes a silicon substrate; a portion of the silicon substrate is exposed at the bottom of the first trench 104, and after Step S204, the method further includes following steps.

S302: Implanting a First Metallic Material into the Bottom of the First Trench.

In some embodiments, the first metallic material is implanted into the exposed silicon substrate at the bottom of the first trench 104 by means of an ion implantation process, where an implantation angle, an implantation depth, and an implantation dose of the ion implantation process are set according to actual needs. For example, the first metallic material includes one or more of cobalt, tungsten, aluminum, and titanium.

S304: Performing an Annealing Process, Such that the First Metallic Material Reacts with the Silicon Substrate to Generate a Metal Silicide.

The annealing process such as a rapid thermal annealing process or an plasma annealing process is performed, such that the first metallic material implanted into the silicon substrate reacts with the silicon substrate to generate metal silicides 112, where the metal silicides 112 at the bottoms of adjacent first trenches 104 are in contact with each other. In this way, a bit line structure 114 in the substrate is obtained. For example, Steps S302-S304 of forming the metal silicide 112 (the bit line structure 114) may be performed before Step S202.

S206: Filling the First Trench Up with the Protective Material Layer.

As shown in FIG. 5, the first trench 104 is filled up with the protective material layer 116, that is, a part of the first trench 104 where the first dielectric material layer 106 is not formed is filled up with the protective material layer 116. Exemplarily, a material for forming the protective material layer 116 includes one or more of a nitride, an oxide and an oxynitride, such as silicon dioxide, silicon nitride, and silicon oxynitride. It is to be understood that a constituent material of at least one of the protective material layer 116, the hard mask layer 110 and the barrier layer 108 is different from others, or the constituent materials thereof are different. For example, the constituent material of the protective material layer 116 is silicon nitride.

S208: Removing a Portion of the First Dielectric Material Layer Adjacent to the Surface of the Substrate, to Obtain the First Dielectric Layer.

As shown in FIG. 6, a portion of the first dielectric material layer 106 adjacent to an upper surface of the substrate is removed by means of a dry etching process and/or a wet etching process, and a reserved portion of the first dielectric material layer 106 is a first dielectric layer 202. It is to be understood that when the barrier layer 108 and/or the hard mask layer 110 are formed on the substrate 102, the barrier layer 108 and/or the hard mask layer 110 protect the substrate 102 (active pillar) between the adjacent first trenches 104 during removal of the portion of the first dielectric material layer 106 adjacent to the upper surface of the substrate, while the barrier layer 108 and/or the hard mask layer 110 may be removed together with the portion of the first dielectric material layer 106 adjacent to the upper surface of the substrate, or may be removed after removal of the portion of the first dielectric material layer 106 adjacent to the upper surface of the substrate.

Figure 7:
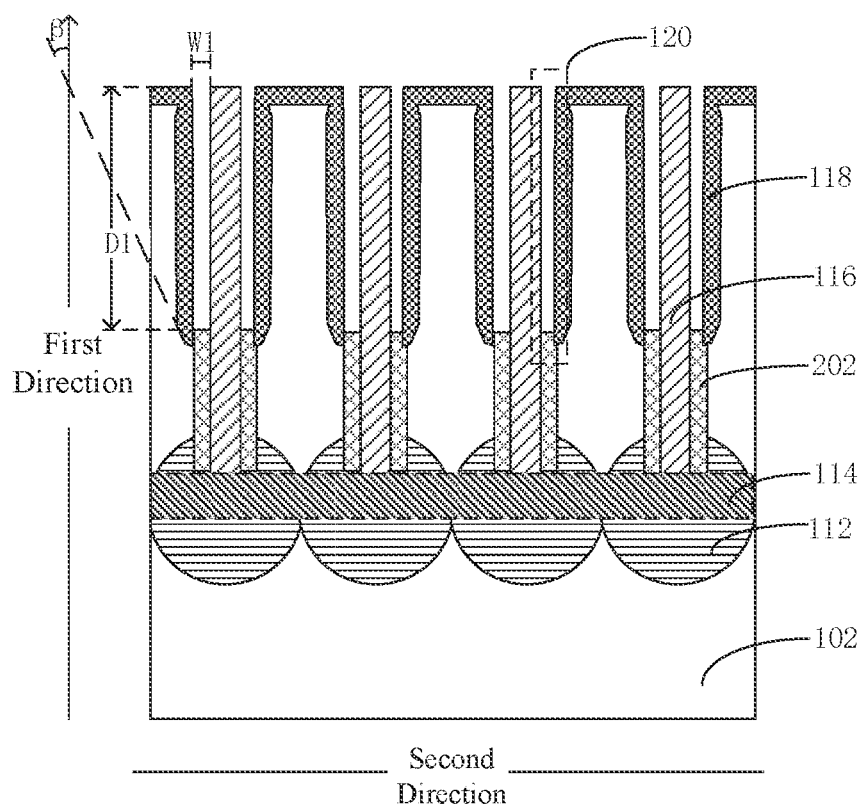
FIG. 7 is a schematic cross-sectional view of a semiconductor structure obtained after a second dielectric layer is formed in an embodiment corresponding to FIG. 6.

FIG. 7 is a schematic cross-sectional view of a semiconductor structure obtained after a second dielectric layer is formed in an embodiment corresponding to FIG. 6. As shown in FIG. 7, a second dielectric layer 118 is formed on a side wall of the first trench 104 where the first dielectric layer 202 is not formed, where the second dielectric layer 118 is in contact with the first dielectric layer 202; and a second trench 120 is formed between the second dielectric layer 118 and the protective material layer 116. That is, the second dielectric layer 118 does not fill up a void between the protective material layer 116 and the first trench 104. For example, a material for forming the second dielectric layer 118 includes one or more of a nitride, an oxide and an oxynitride, such as silicon dioxide, silicon nitride, and silicon oxynitride. It is to be understood that the material for forming the second dielectric layer 118 may be the same as the material for forming the first dielectric layer 202, or may be different from the material for forming the first dielectric layer 202. For example, the second dielectric layer 118 extends along the side wall of the first trench 104 and covers the substrate 102, thereby isolating the active pillar from an external environment.

With continued reference to FIG. 7, as an example, the substrate 102 further includes active pillars positioned between adjacent first trenches 104, the second dielectric layer 118 includes a first silicon oxide layer, and Step S106 includes: growing the first silicon oxide layer on the side wall of the first trench 104 by means of thermal oxidation. Compared with other methods of forming the second dielectric layer 118, the process of forming the second dielectric layer 118 by means of thermal oxidation has simple steps and convenient operation, thereby reducing production costs of the semiconductor structure.

With continued reference to FIG. 7, as an example, an angle $\beta$ between a bottom of the second dielectric layer 118 and a first direction is greater than 0° and less than or equal to 90°, where the first direction refers to a direction where the bottom of the first trench 104 points to an opening of the first trench 104. In some embodiments, when a ratio of a distance D1 between an upper surface of the first dielectric layer 202 and the opening of the first trench 104 in the first direction to a width W1 of the first dielectric layer 202 in a second direction is less than or equal to a preset value, a difference value between a concentration of an oxidant on the upper surface of the first dielectric layer 202 and a concentration of the oxidant at a top of the first trench during the thermal oxidation may be ignored. In this case, a bottom of the second dielectric layer 118 is parallel to the second direction, and the angle $\beta$ is equal to 90°, where the second direction refers to a direction of connecting lines between the adjacent first trenches 104, and the second direction is perpendicular to the first direction. When the ratio of the distance D1 between the upper surface of the first dielectric layer 202 and the opening of the first trench 104 in the first direction to the width W1 of the first dielectric layer 202 in the second direction is greater than the preset value, the difference value between the concentration of the oxidant on the upper surface of the first dielectric layer 202 and the concentration of the oxidant at the top of the first trench during the thermal oxidation is relatively large. In this case, a bottom width of the second dielectric layer 118 is smaller than a top width of the second dielectric layer 118, where the width here refers to the width of the second dielectric layer along the second direction, and a tilt angle $\beta$ between the bottom of the second dielectric layer 118 and the first direction is greater than 0° and less than 90°.

Figure 8:
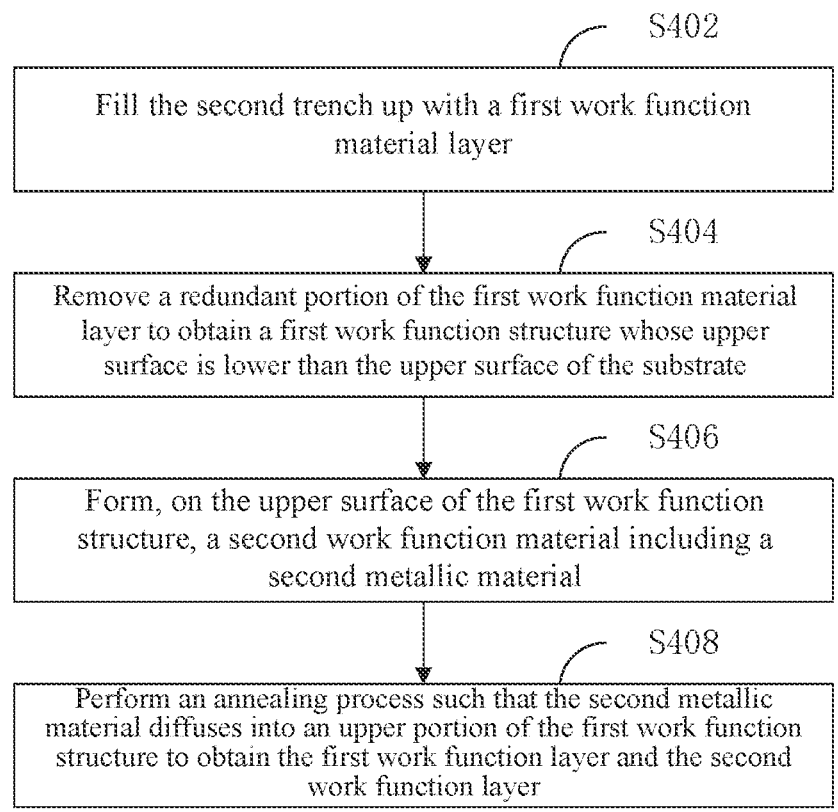
FIG. 8 is a schematic flowchart of Step S108 in an embodiment.
Figure 9:
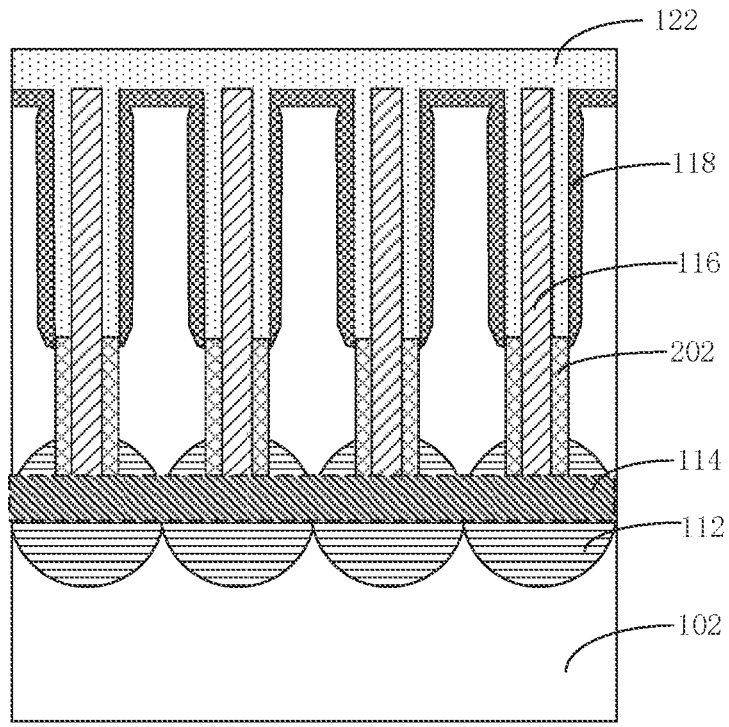
FIG. 9 is a schematic cross-sectional view of a semiconductor structure obtained after a first work function material layer is formed in an embodiment corresponding to FIG. 7.
Figure 10:
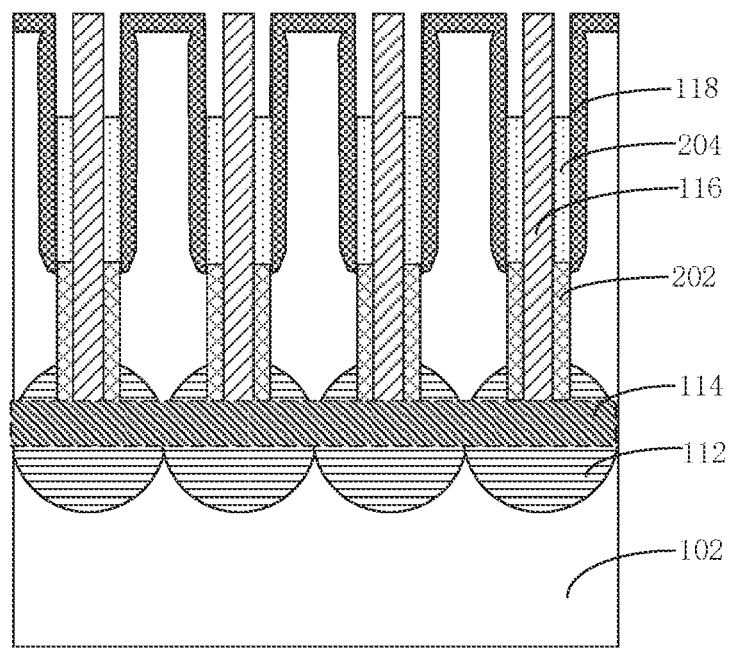
FIG. 10 is a schematic cross-sectional view of a semiconductor structure obtained after a first work function structure is formed in an embodiment corresponding to FIG. 9.
Figure 11:
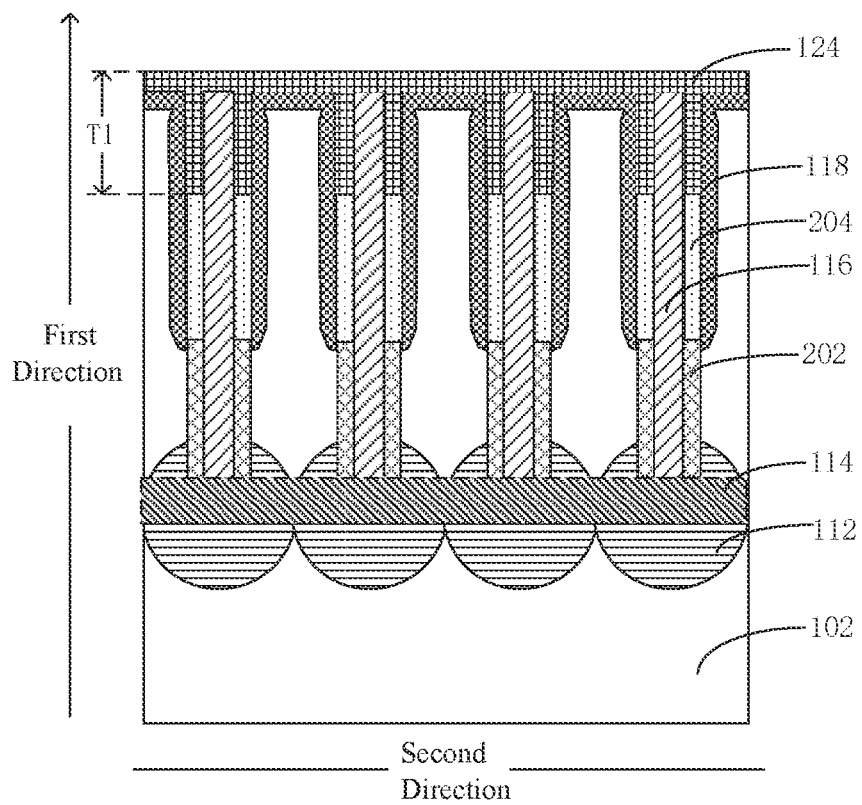
FIG. 11 is a schematic cross-sectional view of a semiconductor structure obtained after a second work function material layer is formed in an embodiment corresponding to FIG. 10.
Figure 12:
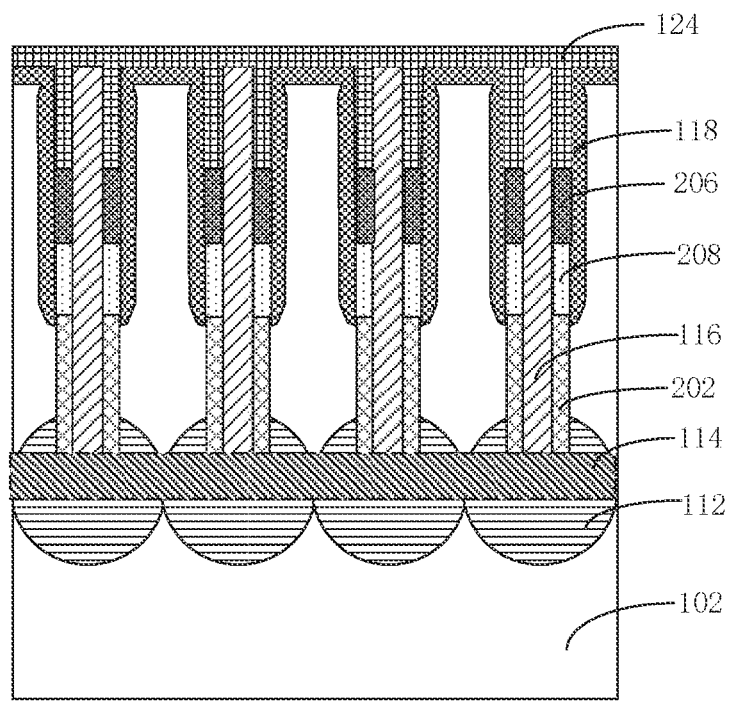
FIG. 12 is a schematic cross-sectional view of a semiconductor structure obtained after a second work function layer is formed in an embodiment corresponding to FIG. 11.

FIG. 8 is a schematic flowchart of Step S108 in an embodiment; FIG. 9 is a schematic cross-sectional view of a semiconductor structure obtained after a first work function material layer is formed in an embodiment corresponding to FIG. 7; FIG. 10 is a schematic cross-sectional view of a semiconductor structure obtained after a first work function structure is formed in an embodiment corresponding to FIG. 9; FIG. 11 is a schematic cross-sectional view of a semiconductor structure obtained after a second work function material layer is formed in an embodiment corresponding to FIG. 10; and FIG. 12 is a schematic cross-sectional view of a semiconductor structure obtained after a second work function layer is formed in an embodiment corresponding to FIG. 11. As shown in FIG. 8, FIG. 9, FIG. 10, FIG. 11 and FIG. 12, as an example, Step S108 includes following steps.

S402: Filling the Second Trench Up with a First Work Function Material Layer.

As shown in FIG. 9, the second trench 120 is filled up with a first work function material layer 122. For example, an upper surface of the first work function material layer 122 is higher than or equal to the upper surface of the substrate 102.

S404: Removing a Redundant Portion of the First Work Function Material Layer to Obtain a First Work Function Structure Whose Upper Surface is Lower than the Upper Surface of the Substrate.

As shown in FIG. 10, a redundant portion of the first work function material layer 122 in the second trench 120 is removed by means of an etching process to obtain a first work function structure 204 formed by a remaining portion of the first work function material layer 122 in the second trench 120, and an upper surface of the first work function structure 204 is lower than the upper surface of the substrate 102. It is to be understood that when the upper surface of the first work function material layer 122 is higher than or equal to the upper surface of the substrate 102, the first work function material layer 122 positioned on the substrate 102 may be completely removed while a redundant portion of the first work function material layer 122 in the second trench 120 is removed, or a portion of the first work function material layer 122 positioned on the substrate 102 may be removed while a redundant portion of the first work function material layer 122 in the second trench 120 is removed, and then a remaining portion of the first work function material layer 122 on the substrate 102 is removed after the first work function structure 204 is formed.

S406: Forming, on the Upper Surface of the First Work Function Structure, a Second Work Function Material Including a Second Metallic Material.

As shown in FIG. 11, a second work function material layer 124 is formed on the upper surface of the first work function structure 204, where the second work function material layer 124 includes a second metallic material. That is, the second work function material layer 124 fills up the second trench 120 where the first work function structure 204 is not formed. A height T1 of the second work function material layer 124 in the first direction only needs to meet a requirement for subsequent formation of the work function structure. As an example, the upper surface of the second work function material layer 124 is not lower than the upper surface of the substrate 102. That is, the upper surface of the second work function material layer 124 is higher than the upper surface of the substrate 102, or the upper surface of the second work function material layer 124 is flush with the upper surface of the substrate 102.

S408: Performing an Annealing Process Such that the Second Metallic Material Diffuses into an Upper Portion of the First Work Function Structure to Obtain the First Work Function Layer and the Second Work Function Layer.

As shown in FIG. 12, an annealing process (a heat treatment process such as a rapid annealing process or a plasma annealing process) is performed, such that the second metallic material in the second work function material layer 124 diffuses into an upper portion of the first work function structure 204 to form a second work function layer 206 and obtain a first work function layer 208 formed from a remaining portion of the first work function structure 204. That is, the portion of the first work function structure 204 diffused by the second metallic material forms the second work function layer 206, and the remaining portion thereof is the first work function layer 208.

Figure 13:
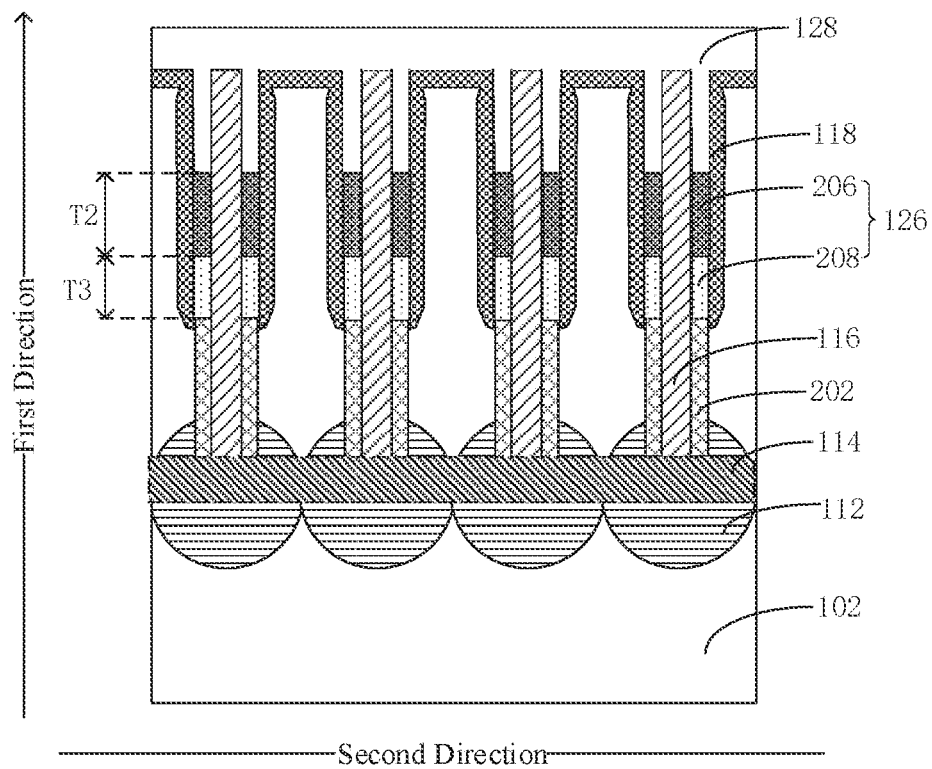
FIG. 13 is a schematic cross-sectional view of a semiconductor structure obtained after an isolation material layer is formed in an embodiment.

FIG. 13 is a schematic cross-sectional view of a semiconductor structure obtained after an isolation material layer is formed in an embodiment. As shown in FIG. 13, as an example, after Step S408, the method further includes: removing the second work function material layer 124 on an upper surface of the second work function layer 206.

Figure 14:
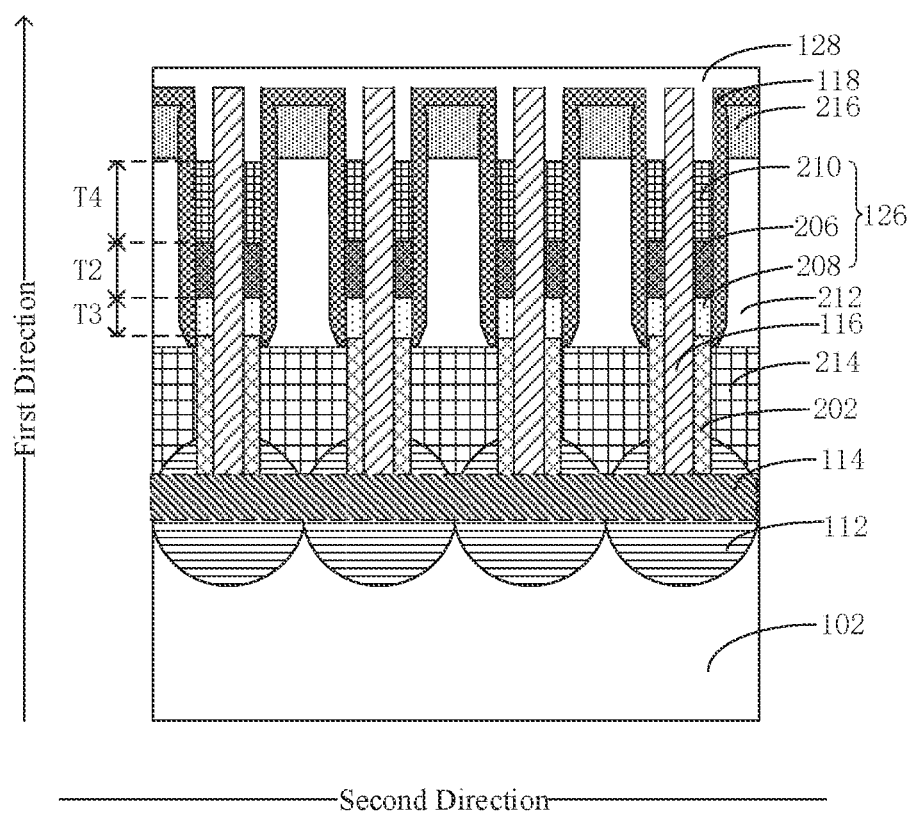
FIG. 14 is a schematic cross-sectional view of a semiconductor structure obtained after an isolation material layer is formed in another embodiment.

FIG. 14 is a schematic cross-sectional view of a semiconductor structure obtained after an isolation material layer is formed in another embodiment. As shown in FIG. 14, as an example, the work function structure 126 further includes a third work function layer 210 positioned on the upper surface of the second work function layer 206. After Step S408, the method further includes: removing a portion of the second work function material layer 124 on the upper surface of the second work function layer 206 to obtain the third work function layer 210 formed from a remaining portion of the second work function material layer 124, where the work function of the third work function layer 210 is smaller than that of the second work function layer 206. By means of this setting, the work function of the work function structure 126 may be further reduced, such that the leakage current of the semiconductor structure using the work function structure 126 as a gate structure is further reduced, and the electrical stability and the performance of the semiconductor structure are improved. For example, an upper surface of the third work function layer 210 is lower than the upper surface of the substrate 102.

As an example, the first work function material layer 122 includes a third metallic material, and a work function of the third metallic material is greater than that of the second metallic material.

As an example, the third metallic material includes titanium, and the second metallic material includes at least one of lanthanum, zirconium, hafnium, and aluminum.

As an example, the first work function material layer 122 includes a titanium nitride material layer, and the second work function material layer 124 includes a lanthanum oxide material layer or a zirconia material layer.

As shown in FIG. 13, as an example, in the first direction, a height T2 of the second work function layer 206 is greater than or equal to a height T3 of the first work function layer 208. The work function of the second work function layer 206 is smaller than that of the first work function layer 208. Under the condition that a height of the work function structure 126 in the first direction remains unchanged, the work function of the work function structure 126 may be reduced by increasing the height T2 of the second work function layer 206, thereby improving the electrical stability and the performance of the semiconductor structure. For example, a ratio of the height T2 to the height T3 is greater than or equal to 1 and less than or equal to 2, such as 1, 1.3, 1.5, 1.7, 1.9, and 2.0.

As shown in FIG. 14, as an example, in the first direction, a height T4 of the third work function layer 210 is greater than or equal to the height T2 of the second work function layer 206, and the height T4 of the third work function layer 210 is greater than or equal to the height T3 of the first work function layer 208. The work function of the third work function layer 210 is smaller than the work function of the second work function layer 206 and is smaller than the work function of the first work function layer 208. Under the condition that the height of the work function structure 126 in the first direction remains unchanged, the work function of the work function structure 126 may be reduced by increasing the height T4 of the third work function layer 210, thereby improving the electrical stability and the performance of the semiconductor structure.

As shown in FIG. 13 and FIG. 14, as an example, the upper surface of the work function structure 126 is lower than the upper surface of the substrate 102, and after the filling the second trench 120 to form a work function structure 126, the method further includes: forming an isolation material layer 128 on an upper surface of the work function structure 126, where an upper surface of the isolation material layer 128 is not lower than the upper surface of the substrate 102. The isolation structure layer 128 can isolate the work function structure 126, thereby eliminating adverse effects of external environment on the work function structure 126.

As an example, the isolation material layer 128 and the protective material layer 116 are formed from the same material.

With continued reference to FIG. 14, as an example, the method for fabricating a semiconductor structure further includes: forming a source region and a drain region in the active pillar between the adjacent first trenches 104, where the active pillar between the work function structures 126 positioned in the adjacent first trenches 104 is a drift region 212, and a first portion 214 between the drift region 212 and the bit line structure 114 and a second portion 216 between the drift region 212 and the upper surface of the substrate 102 are respectively the source region and the drain region. For example, the first portion 214 between the drift region 212 and the bit line structure 114 is the drain region, and the second portion 216 between the drift region 212 and the upper surface of the substrate 102 is the source region. It is to be understood that the source region and the drain region may be formed before the work function structure 126 is formed, or may be formed after the work function structure 126 is formed, which is not limited here.

As an example, the method for fabricating a semiconductor structure further includes: forming a capacitor structure on the isolation material layer 128, where the capacitor structure is electrically connected to the work function structure 126 by means of a conductive structure penetrating through the isolation material layer 128 (not shown in the figure).

It is to be understood that although the various steps in the flowcharts of FIG. 1, FIG. 2, FIG. 3 and FIG. 8 are displayed in sequence as indicated by the arrows, these steps are not necessarily performed in sequence in the order indicated by the arrows. Unless expressly stated herein, the execution of these steps is not strictly restrictive and may be performed in other order. Moreover, at least some of the steps in FIG. 1, FIG. 2, FIG. 3 and FIG. 8 may include a plurality of sub-steps or a plurality of stages, which are not necessarily performed at the same moment, but may be executed at different moments, and the order of execution of these sub-steps or stages is not necessarily performed sequentially, but may be performed alternately or alternately with at least a portion of the sub-steps or stages of other steps or other steps.

As shown in FIG. 4, FIG. 7 and FIG. 13, the present disclosure further provides a semiconductor structure, which includes: a substrate 102, a protective material layer 116, a first dielectric layer 202, a second dielectric layer 118, and a work function structure 126. A first trench 104 is formed in the substrate 102, the protective material layer 116 is positioned in the first trench 104, and the first dielectric layer 202 is positioned on a side wall of the first trench 104 and is positioned between the protective material layer 116 and the substrate 102. The second dielectric layer 118 is positioned on the side wall of the first trench 102, and the second dielectric layer 118 is in contact with the first dielectric layer 202 and is positioned between the protective material layer 116 and the substrate 102, and a second trench 120 is provided between the second dielectric layer 118 and the protective material layer 116. The work function structure 126 is positioned in the second trench 120, and the work function structure 126 includes a first work function layer 208 and a second work function layer 206, where the second work function layer 206 is positioned on an upper surface of the first work function layer 208, and a work function of the second work function layer 206 is smaller than that of the first work function layer 208.

In some embodiments, the substrate 102 may use undoped single crystal silicon, single crystal silicon doped with impurities, silicon-on-insulator (SOI), stacked silicon-on-insulator (SSOI), stacked silicon-germanium-on-insulator (S—SiGeOI), silicon-germanium-on-insulator (SiGeOI), and germanium-on-insulator (GeOI), etc. As an example, in this embodiment, a material for forming the substrate 102 is single crystal silicon. The first dielectric layer 202 is positioned between the protective material layer 116 and the substrate 102, and the upper surface of the first dielectric layer 202 is lower than the upper surface of the substrate 102, thereby exposing part of the side wall of the first trench 104. It is to be understood that the first dielectric layer 202 is positioned on a side wall of the first trench 104 away from the opening, and a side wall of the first trench 104 close to the opening is exposed and is not covered by the first dielectric layer 202. Exemplarily, the first dielectric layer 202 may extend along the side wall of the first trench 104 to cover the bottom of the first trench 104, or may only cover the side wall of the first trench 104 away from the opening. The second dielectric layer 118 is positioned on the side wall of the first trench 104 near the opening and not covered by the first dielectric layer 202, and the second dielectric layer 118 is in contact with the first dielectric layer 202 positioned on the side wall of the first trench 104, where a void between the second dielectric layer 118 and the protective material layer 116 in the first trench 104 is the second trench 120. The work function structure 126 is positioned in the second trench 120, and the work function structure 126 may be used as a gate structure of a transistor or a word line structure of a memory device, where the work function of the second work function layer 206 is smaller than that of the first work function layer 208.

In the above semiconductor structure, a first trench is formed in a substrate, a protective material layer is formed in the first trench, and a first dielectric layer is positioned between the protective material layer and the substrate. A second dielectric layer is positioned on an exposed side wall of the first trench and is in contact with the first dielectric layer, and a second trench is formed between the second dielectric layer and the protective material layer. A work function structure is positioned in the second trench, where the work function structure includes a first work function layer and a second work function layer positioned on an upper surface of the first work function layer, and a work function of the second work function layer is smaller than a work function of the first work function layer. Without changing a resistance, leakage current of the semiconductor structure using the work function structure as a gate structure is reduced, and electrical stability and performance of the semiconductor structure are improved.

For example, a material for forming the first dielectric material layer 202 includes one or more of a nitride, an oxide, and an oxynitride, such as silicon dioxide, silicon nitride, and silicon oxynitride. For example, the material for forming the first dielectric material layer 202 is silicon dioxide.

As shown in FIG. 4, as an example, the semiconductor structure further includes: a barrier layer 108 on the substrate 102. The substrate 102 (active pillar) between adjacent first trenches 104 may be isolated by means of the barrier layer 108, thereby avoiding having a negative effect on the substrate 102 (active pillar) between the adjacent first trenches 104 during a subsequent process of forming a metal silicide. For example, a material for forming the barrier layer 108 includes one or more of a nitride, an oxide and an oxynitride, such as silicon dioxide, silicon nitride, and silicon oxynitride.

As an example, the semiconductor structure further includes a hard mask layer 110 positioned on the substrate 102. A shape and a position of the first trench 104 may be defined by means of the hard mask layer 110, and the hard mask layer 110 may also serve as an isolation structure in the process of forming the metal silicide, thereby further avoiding having a negative effect on the substrate 102 (active pillar) between the adjacent first trenches 104 in the process of forming the metal silicide. For example, the hard mask layer 110 is formed on an upper surface of the barrier layer 108. For example, a material for forming the hard mask layer 110 includes one or more of a nitride, an oxide, and an oxynitride, such as silicon dioxide, silicon nitride, and silicon oxynitride. It is to be understood that the material for forming the hard mask layer 110 and the material for forming the barrier layer 108 may be same or may be different. For example, the material for forming the hard mask layer 110 is silicon nitride, and the material for forming the barrier layer 108 is silicon dioxide.

In one embodiment, the substrate 102 includes a silicon substrate, and the bottom of the first trench 104 exposes a part of the silicon substrate. The semiconductor structure further includes metal silicides 112 positioned at the bottom of the first trench 104, where the metal silicides 112 at the bottoms of adjacent two first trenches 104 are in contact with each other, thereby obtaining the bit line structure 114 in the substrate. Exemplarily, a first metal material in the metal silicide 112 includes one or more of cobalt, tungsten, aluminum, and titanium.

As an example, a material for forming the protective layer 116 includes one or more of a nitride, an oxide and an oxynitride, such as silicon dioxide, silicon nitride, and silicon oxynitride. It is to be understood that a constituent material of at least one of the protective material layer 116, the hard mask layer 110 and the barrier layer 108 is different from others, or the constituent materials thereof are different. For example, the constituent material of the protective material layer 116 is silicon nitride.

As an example, a material for forming the second dielectric layer 118 includes one or more of a nitride, an oxide and an oxynitride, such as silicon dioxide, silicon nitride, and silicon oxynitride. It is to be understood that the material for forming the second dielectric layer 118 may be the same as the material for forming the first dielectric layer 202, or may be different from the material for forming the first dielectric layer 202. For example, the second dielectric layer 118 extends along the side wall of the first trench 104 and covers the substrate 102, thereby isolating the active pillar from an external environment.

As shown in FIG. 7, as an example, an angle between a bottom of the second dielectric layer 118 and a first direction is greater than 0° and less than or equal to 90°, where the first direction refers to a direction where the bottom of the first trench 104 points to an opening of the first trench 104. In some embodiments, when a ratio of a distance D1 between an upper surface of the first dielectric layer 202 and the opening of the first trench 104 in the first direction to a width W1 of the first dielectric layer 202 in a second direction is less than or equal to a preset value, a difference value between a concentration of an oxidant on the upper surface of the first dielectric layer 202 and a concentration of the oxidant at a top of the first trench during the thermal oxidation may be ignored. In this case, a bottom of the second dielectric layer 118 is parallel to the second direction, and the angle β is equal to 90°, where the second direction refers to a direction of connecting lines between the adjacent first trenches 104, and the second direction is perpendicular to the first direction. When the ratio of the distance D1 between the upper surface of the first dielectric layer 202 and the opening of the first trench 104 in the first direction to the width W1 of the first dielectric layer 202 in the second direction is greater than the preset value, the difference value between the concentration of the oxidant on the upper surface of the first dielectric layer 202 and the concentration of the oxidant at the top of the first trench during the thermal oxidation is relatively large. In this case, a bottom width of the second dielectric layer 118 is smaller than a top width of the second dielectric layer 118, where the width here refers to the width of the second dielectric layer along the second direction, and a tilt angle β between the bottom of the second dielectric layer 118 and the first direction is greater than 0° and less than 90°.

As an example, the second work function layer 206 includes a second metallic material, and the first work function layer 208 includes a third metallic material, where the work function of the third metallic material is greater than that of the second metallic material.

As an example, the third metallic material includes titanium, and the second metallic material includes at least one of lanthanum, zirconium, hafnium, and aluminum.

As shown in FIG. 14, as an example, the work function structure 126 further includes a third work function layer 210, and the third work function layer 210 is positioned on the upper surface of the second work function layer 206 where the third work function layer 210 includes the second metallic material. A work function of the third work function layer 210 is smaller than that of the second work function layer 206. By means of this setting, the work function of the work function structure 126 may be further reduced, such that the leakage current of the semiconductor structure using the work function structure 126 as a gate structure is further reduced, and the electrical stability and the performance of the semiconductor structure are improved. For example, an upper surface of the third work function layer 210 is lower than the upper surface of the substrate 102.

As an example, the first work function layer 208 includes a titanium nitride layer, and the third work function layer 206 includes a lanthanum oxide layer or a zirconium oxide layer.

As shown in FIG. 13, as an example, in the first direction, a height T2 of the second work function layer 206 is greater than or equal to a height T3 of the first work function layer 208. The work function of the second work function layer 206 is smaller than that of the first work function layer 208. Under the condition that a height of the work function structure 126 in the first direction remains unchanged, the work function of the work function structure 126 may be reduced by increasing the height T2 of the second work function layer 206, thereby improving the electrical stability and the performance of the semiconductor structure. For example, a ratio of the height T2 to the height T3 is greater than or equal to 1 and less than or equal to 2, such as 1, 1.3, 1.5, 1.7, 1.9, and 2.0.

As shown in FIG. 14, as an example, in the first direction, a height T4 of the third work function layer 210 is greater than or equal to the height T2 of the second work function layer 206, and the height T4 of the third work function layer 210 is greater than or equal to the height T3 of the first work function layer 208. The work function of the third work function layer 210 is smaller than the work function of the second work function layer 206 and is smaller than the work function of the first work function layer 208. Under the condition that the height of the work function structure 126 in the first direction remains unchanged, the work function of the work function structure 126 may be reduced by increasing the height T4 of the third work function layer 210, thereby improving the electrical stability and the performance of the semiconductor structure.

As shown in FIG. 13 and FIG. 14, as an example, the upper surface of the work function structure 216 is lower than the upper surface of the substrate. The semiconductor structure further includes an isolation material layer 128 positioned on the upper surface of the work function structure 126, where the upper surface of the isolation material layer 128 is not lower than the upper surface of the substrate 102. The isolation structure layer 128 can isolate the work function structure 126, thereby eliminating adverse effects of external environment on the work function structure 126.

As an example, the isolation material layer 128 and the protective material layer 116 are formed from the same material.

With continued reference to FIG. 14, as an example, the semiconductor structure further includes a source region and a drain region, both positioned in the active pillar between the adjacent first trenches 104, where the active pillar between the work function structures 126 positioned in the adjacent first trenches 104 is a drift region 212, and a first portion 214 between the drift region 212 and the bit line structure 114 and a second portion 216 between the drift region 212 and the upper surface of the substrate 102 are respectively the source region and the drain region. For example, the first portion 214 between the drift region 212 and the bit line structure 114 is the drain region, and the second portion 216 between the drift region 212 and the upper surface of the substrate 102 is the source region.

As an example, the semiconductor structure further includes a capacitor structure positioned on the isolation material layer 128, where the capacitor structure is electrically connected to the work function structure 126 by means of a conductive structure penetrating through the isolation material layer 128 (not shown in the figure).

As an example, the semiconductor structure includes a transistor or memory device.

The embodiments in the specification are described in a progressive manner. Each embodiment is focused on difference from other embodiments. And cross reference is available for identical or similar parts among different embodiments.

Technical features of the above embodiments may be arbitrarily combined. For simplicity, all possible combinations of the technical features in the above embodiments are not described. However, as long as the combination of these technical features is not contradictory, it shall be deemed to be within the scope recorded in this specification.

The above embodiments merely express several implementations of the embodiments of the present disclosure, and descriptions thereof are relatively concrete and detailed. However, these embodiments are not thus construed as limiting the patent scope of the present disclosure. It is to be pointed out that for persons of ordinary skill in the art, some modifications and improvements may be made under the premise of not departing from a conception of the embodiments of the present disclosure, which shall be regarded as falling within the scope of protection of the embodiments of the present disclosure. Thus, patent protection scope of the embodiments of the present disclosure shall be subject to the appended claims.

What is claimed is:

1. A semiconductor structure, comprising:
a substrate, a first trench being formed in the substrate;
a protective material layer positioned in the first trench;
a first dielectric layer positioned on a side wall of the first trench and between the protective material layer and the substrate;
a second dielectric layer positioned on the side wall of the first trench, the second dielectric layer being in contact with the first dielectric layer and positioned between the protective material layer and the substrate, a second trench being provided between the second dielectric layer and the protective material layer; and
a work function structure positioned in the second trench, the work function structure comprising a first work function layer and a second work function layer;
wherein the second work function layer is positioned on an upper surface of the first work function layer, and a work function of the second work function layer is smaller than a work function of the first work function layer.

2. The semiconductor structure according to claim 1, wherein
an angle between a bottom of the second dielectric layer and a first direction is greater than 0° and less than or equal to 90°, the first direction referring to a direction where a bottom of the first trench points to an opening of the first trench.

3. The semiconductor structure according to claim 1, wherein
the second work function layer comprises a second metallic material, the first work function layer comprising a third metallic material, a work function of the third metallic material being greater than a work function of the second metallic material.

4. The semiconductor structure according to claim 3, wherein
the third metallic material comprises titanium, the second metallic material comprising at least one of lanthanum, zirconium, hafnium, and aluminum.

5. The semiconductor structure according to claim 3, wherein
the work function structure further comprises:
a third work function layer positioned on an upper surface of the second work function layer, wherein the third work function layer comprises the second metallic material.

6. The semiconductor structure according to claim 1, wherein
an upper surface of the work function structure is lower than an upper surface of the substrate, the semiconductor structure further comprising:
an isolation material layer positioned on the upper surface of the work function structure, an upper surface of the isolation material layer being not lower than the upper surface of the substrate.

7. The semiconductor structure according to claim 1, wherein
a height of the second work function layer is greater than or equal to a height of the first work function layer.

* * * * *